United States Patent [19]
Fukuta et al.

[11] Patent Number: 5,153,705
[45] Date of Patent: Oct. 6, 1992

[54] TAB PACKAGE AND A LIQUID-CRYSTAL PANEL UNIT USING THE SAME

[75] Inventors: Kazuhiko Fukuta, Tenri; Naoyuki Tajima; Yasunori Chikawa, both of Kita-Katsuragi; Takaski Tsuda, Tenri; Takamichi Maeda, Yamato-Koriyama, all of Japan

[73] Assignee: Sharp Kabushiki Kaisha, Japan

[21] Appl. No.: 665,154

[22] Filed: Mar. 6, 1991

[30] Foreign Application Priority Data

Nov. 28, 1990 [JP] Japan .................. 2-331468

[51] Int. Cl.$^5$ .......................... H01L 23/48
[52] U.S. Cl. ........................ 357/70; 357/80; 357/72; 361/408
[58] Field of Search ............ 357/72, 70, 80, 74; 361/404, 405, 408, 397

[56] References Cited

U.S. PATENT DOCUMENTS

| | | | |
|---|---|---|---|
| 4,684,974 | 8/1987 | Matsunaga et al. | 357/70 |
| 4,887,149 | 12/1989 | Ramano' | 357/74 |
| 4,949,158 | 8/1990 | Ueda | 357/70 |
| 4,967,260 | 10/1990 | Butt | 357/80 |
| 5,018,005 | 5/1991 | Lin et al. | 357/74 |

FOREIGN PATENT DOCUMENTS

| | | | |
|---|---|---|---|
| 61-8960 | 1/1986 | Japan | 357/70 |
| 61-208859 | 9/1986 | Japan | 357/70 |
| 63-250849 | 10/1988 | Japan | 357/70 |

OTHER PUBLICATIONS

"TAB Tape Structure for Area Array TAB," IBM Technical Disclosure Bulletin, vol. 32, No. 2, Jul. 1989, pp. 305-306.

"Stress Relief Method for TAB Modules," IBM Technical Disclosure Bulletin, vol. 33, No. 10B, Mar. 1991, pp. 158-159.

Primary Examiner—Andrew J. James
Assistant Examiner—Courtney A. Bowers
Attorney, Agent, or Firm—Nixon & Vanderhye

[57] ABSTRACT

A TAB package for packaging a semiconductor chip includes a flexible base plate having a first surface and a second surface opposite to the first surface, an input and output leads being formed on the second surface of the flexible base plate and capable of being connected to the semiconductor chip, and a plurality of slits being formed on the first surface of the flexible base plate. Accordingly, the TAB package is allowed to be easily bent and kept in the bending state. The slits are formed in a manner to correspond to the intervals between the adjacent input and output leads so that the input and output leads can be reliably supported by the flexible base plate.

14 Claims, 10 Drawing Sheets

Fig. 7
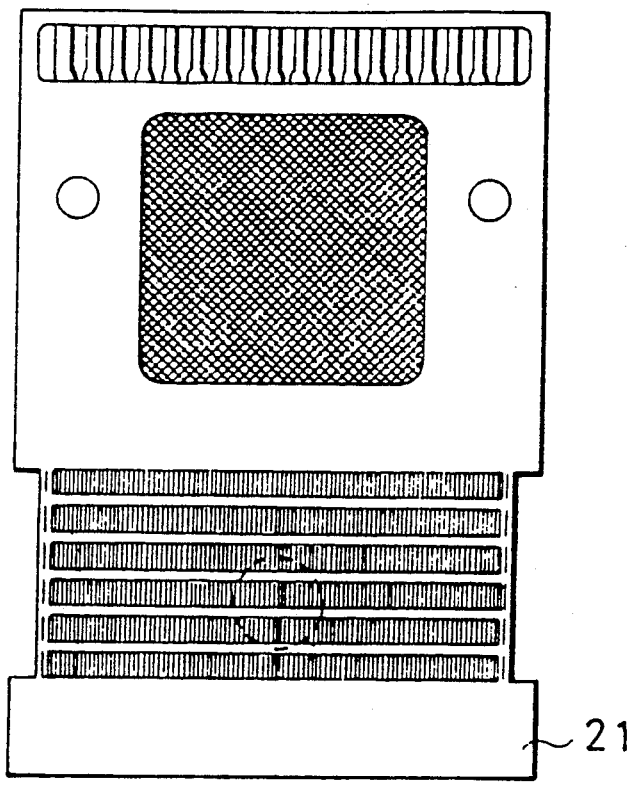
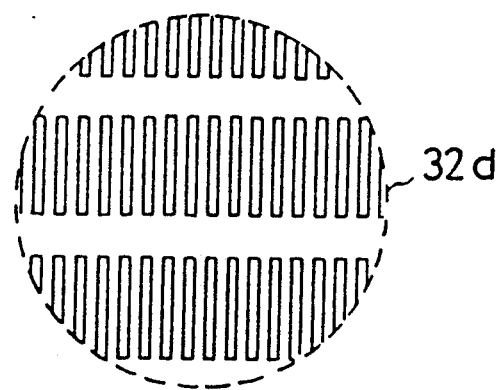
Fig. 7A

Fig. 9
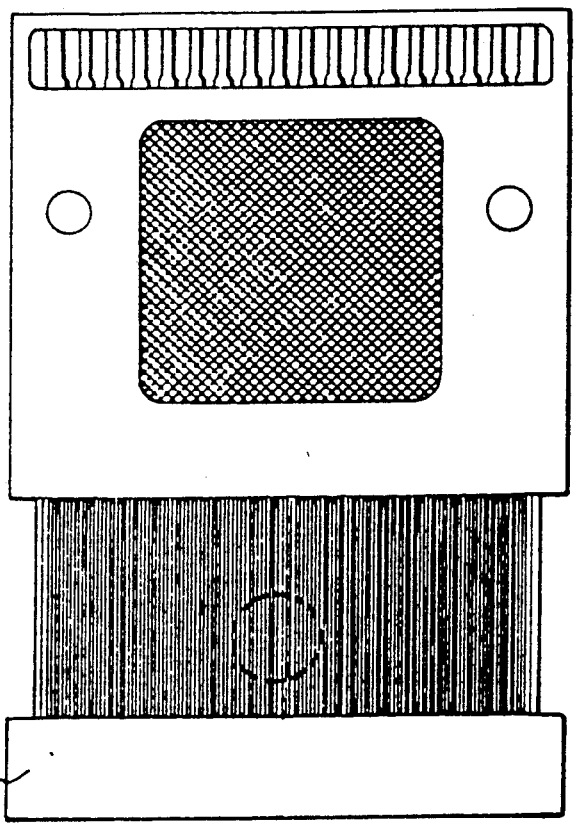
21
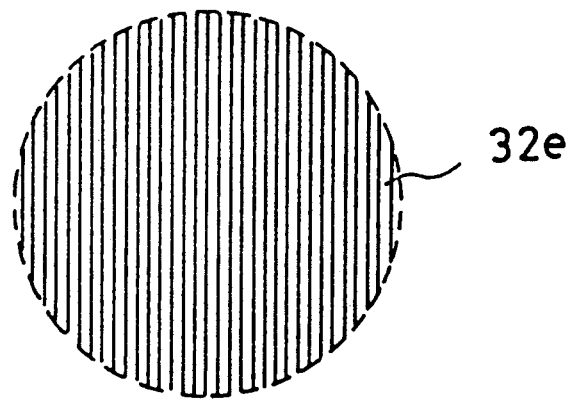
32e
Fig. 9A

TAB PACKAGE AND A LIQUID-CRYSTAL PANEL UNIT USING THE SAME

BACKGROUND OF THE INVENTION

1. Field of the Invention

The present invention relates to a two-layered TAB (Tape Automated Bonding) package which includes a conductive pattern and a flexible base material. More particularly, the invention relates to the TAB package which is capable of packaging a semiconductor chip thereon and connecting a printed circuit board or the like.

The present invention relates to a liquid-crystal panel unit using the TAB package.

2. Description of the Related Art

The inventors of the present invention know that the TAB package has been made to have a tape-like insulated flexible base material allowing a chip to be packaged thereon. The flexible base material contains conductive patterns for connecting the chip to a printed circuit board or the like. The insulated flexible base material normally employs polyimide or polyester as its material.

When the TAB package is used for composing a liquid-crystal panel unit having a liquid-crystal panel and a printed circuit board connected therewith, the TAB package is designed to package a chip of liquid-crystal-driving LSI (Large Scale Integrated Circuit) on itself for the purpose of connecting the liquid-crystal panel to its relevant printed circuit board.

For reducing the liquid-crystal panel unit in size, the region of the conductive patterns included in the TAB package are bent so that the tips of the conductive patterns, that is, the outer leads are allowed to be connected to the electrodes of the liquid-crystal panel.

As mentioned above, the foregoing TAB package includes the flexible base material on which a packaging area for packaging the chip of the liquid-crystal-driving LSI. The conductive patterns for connecting the chip to the liquid-crystal panel and the input-side outer leads for connecting the chip to the printed circuit board are formed lengthwise on the flexible base material.

In actual arrangement, the liquid-crystal panel is connected to the printed circuit board for composing the liquid-crystal panel unit by using the TAB package having the chip of the liquid-crystal-driving LSI packaged thereon. In packaging operation, the tips of the conductive patterns, that is, the output-side outer leads are connected to the electrodes of the liquid-crystal panel. Then, the region of flexible base material on which the conductive pattern is formed is bent so that the packaging area for packaging the chip is opposed to the conductive patterns. It results in the input-side outer leads being connected to a conductive pattern of the printed circuit board.

The flexible base material included in the TAB package generally has a thickness of 50 $\mu$m to 125 $\mu$m and high stiffness. The thickness and characteristic indicate that the bent flexible base material is likely to be restored to an original, that is, horizontal state. For soldering the liquid-crystal panel to the printed circuit board, therefore, it is necessary to bend the flexible base material and keep the bending state. This is troublesome work.

Hence, the aforementioned TAB package has inferior soldering workability. Further, the relatively large stress of the flexible base material may cause the soldered connection to be broken, thereby damaging the connection between the liquid-crystal panel and the printed circuit board. It results in disadvantageously lowering reliability of the connection.

SUMMARY OF THE INVENTION

It is therefore a first object of the present invention to provide a TAB package which is capable of improving workability of bending a flexible base material and soldering the liquid-crystal panel to the printed circuit board and reliability of the connecting portion between the liquid-crystal panel and the printed circuit board.

It is therefore a second object of the present invention to provide a liquid-crystal panel unit using a TAB package which is capable of improving workability of bending a flexible base material and soldering the liquid-crystal panel to the printed circuit board and reliability of the connecting portion between the liquid-crystal panel and the printed circuit board.

The first object of the invention can be achieved by a TAB package for packaging a semiconductor chip including a flexible base plate having a first surface and a second surface opposite to the first surface, an input and output leads being formed on the second surface of the flexible base plate and capable of being connected to the semiconductor chip, and a plurality of slits being formed on the first surface of the flexible base plate.

The second object of the invention can be achieved by a liquid-crystal panel unit using a TAB package for packaging a semiconductor chip, including a liquid-crystal panel, a printed circuit board, a flexible base plate having a first surface and a second surface opposite to the first surface, an input and output leads being formed on the second surface of the flexible base plate and capable of being connected to the semiconductor chip, and a plurality of slits being formed on the first surface of the flexible base plate.

In operation, in bending the flexible base material having the signal leads formed thereon, the plurality of slits formed on the flexible base material contribute to lowering the restoring force of the flexible base material, because those slits reduce the amount of the flexible base material to some extent. It results in improving workability of bending the flexible base material and soldering the liquid-crystal panel to the printed circuit board and reliability of the soldered portion.

By using the TAB package in the liquid-crystal panel unit, it results in reducing the liquid-crystal panel unit in size.

Further objects and advantages of the present invention will be apparent from the following description of the preferred embodiments of the invention as illustrated in the accompanying drawings.

BRIEF DESCRIPTION OF THE DRAWINGS

FIGS. 7 and 7A are plane views showing a flexible base material surface side of the TAB package made by punching itself out from the tape-like flexible base material along the form punching line;

FIGS. 9 and 9A are plane views showing a flexible base material surface side of another TAB package made by punching itself out from the tape-like flexible base material along the form punching line;

DESCRIPTION OF THE PREFERRED EMBODIMENTS

For deeper understanding of the invention, the known TAB package will be described with reference to FIG. 1 and FIG. 2 before the description about an embodiment of the invention.

Figure 1:
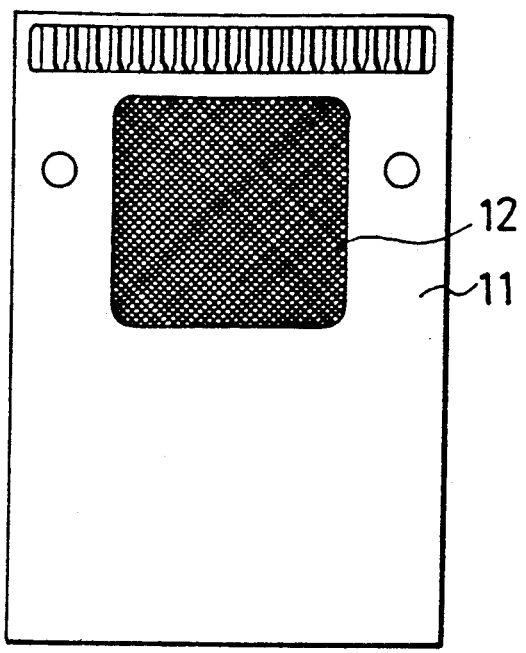
FIG. 1 is a plane view showing a flexible base material surface side of a known TAB package.
Figure 2:
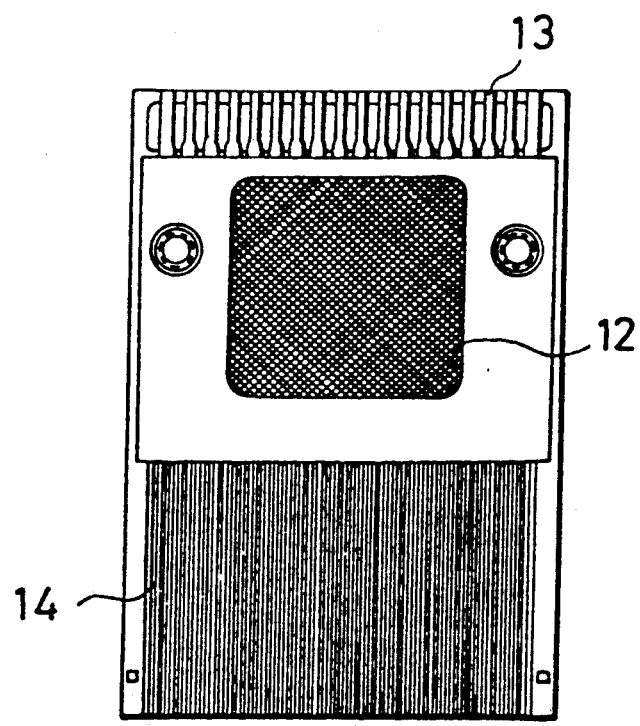
FIG. 2 is a plane view showing a conductive pattern surface side of a known TAB package.

FIG. 1 is a plane view showing a flexible base material surface side of the known TAB package and FIG. 2 is a plane view showing the other surface side, that is, the surface side on which conductive patterns are formed of the TAB package.

In these figures, the outer form of a chip to be packaged is punched out from a flexible base material.

As shown, 11 denotes a flexible base material of the TAB package on which a packaging area 12 is formed for packaging a chip of a liquid-crystal-driving LSI. The flexible base material 11 includes input-side outer leads 13 for connecting the packaged chip to a printed circuit board (not shown) and conductive patterns 14 for connecting the chip to the liquid-crystal panel (not shown). The input-side outer leads 13 and the conductive patterns 14 are respectively formed lengthwise on the both sides of the surface of the flexible base material 11.

In actual arrangement, the liquid-crystal panel is connected to the printed circuit board for composing the liquid-crystal panel unit by using the TAB package having the chip of the liquid-crystal-driving LSI packaged thereon. In packaging operation, the tips of the conductive patterns 14, that is, the output-side outer leads are connected to the electrodes of the liquid-crystal panel. Then, the flexible base material 11 is bent so that the packaging area 12 formed on one surface of the flexible base material 11 is opposed to the conductive patterns 14 formed on the other surface of the flexible base material 11. It results in the input-side outer leads 13 being connected to the conductive patterns formed on the printed circuit board.

An embodiment of the present invention will now be described with reference to the drawings.

Figure 3:
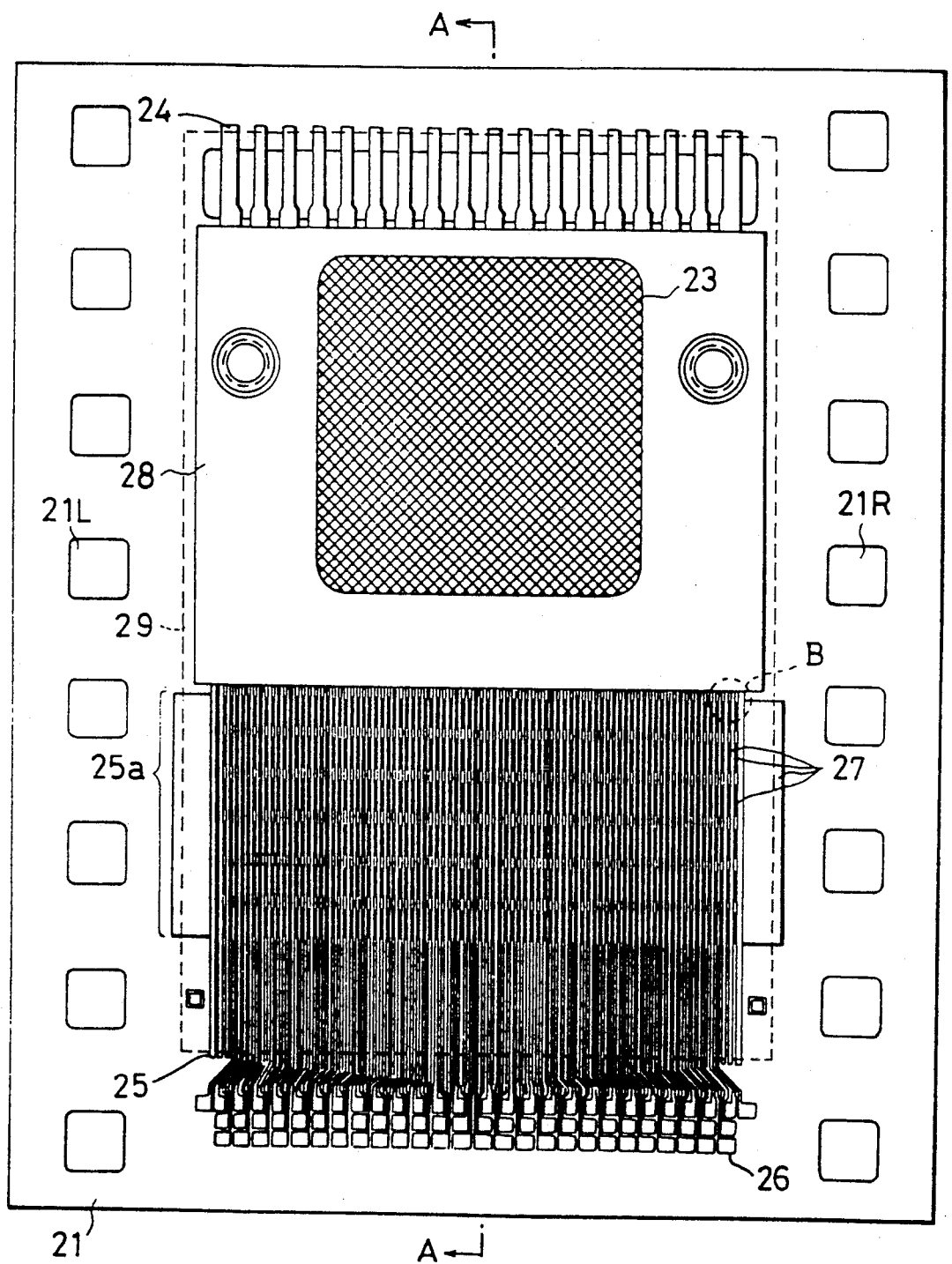
FIG. 3 is a plane view showing a tape-like TAB package according to an embodiment of the invention.
Figure 4:
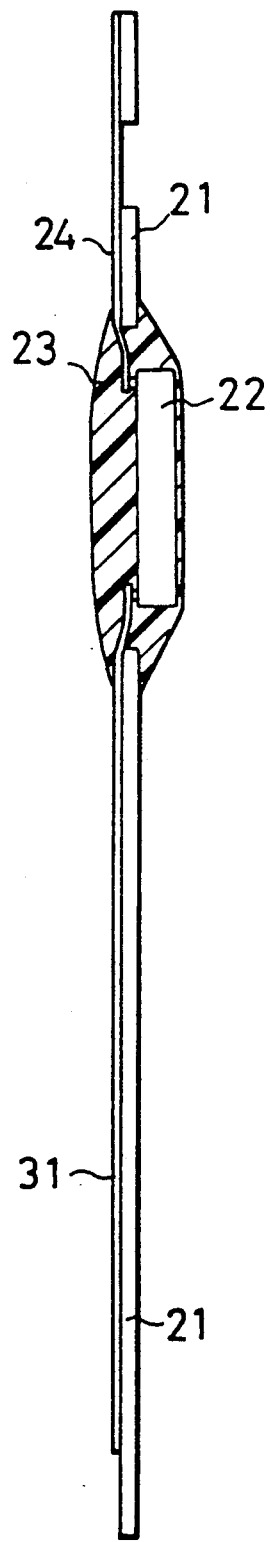
FIG. 4 is a sectional view showing the TAB package cut on the line A—A of FIG. 3.

FIG. 3 is a plane view showing a tape-like TAB package according to an embodiment of the invention. FIG. 4 is a sectional view showing the TAB package cut on the line A—A of FIG. 3.

As shown, 21 denotes an insulated flexible base material, which is made of polyimide or the like and is formed like a tape. 21R and 21L denote perforations formed on the right and left sides of the flexible base material 21. 22 denotes a chip of a liquid-crystal-driving LSI packaged on the flexible base material 21. The chip 22 is sealed by a resin 23 (see FIG. 3). The flexible base material 21 includes an input-side outer leads 24 for receiving a signal sent from the printed circuit board (to be described later) to the chip 22 and output-side outer leads 25 for sending a signal from the chip 22 to a liquid-crystal panel (to be described later). The input-side outer leads 24 and the output-side outer leads 25 are opposed to each other with the chip 22 being located therebetween.

On the tips of the output-side outer leads 25, terminals 26 are respectively formed for picking up an output signal from the chip 22 packaged on the flexible base material 21 for the purpose of testing it in an external device.

25a denotes a bending area defined on the flexible base material 21. The output-side outer leads 25 are formed on the bending area 25a. The flexible base material 21 is intended to be bent lengthwise with respect to the bending area 25a for connecting the liquid-crystal panel to the printed circuit board through the chip 22 for the purpose of composing a reduced liquid-crystal panel unit. The bending area 25a includes a plurality of slits 27 formed along the bending lines for assisting the bending operation.

28 denotes a solder-resisting area for protecting the conductive patterns from the short-circuit by the solder used for connecting the input-side outer leads 24 to the printed circuit board. 29 denotes a form punching line on which an outer form of the TAB package is punched out from the flexible base material tape.

The TAB package is punched out from the flexible base material 21 along the form punching line 29. As is understood from FIG. 3, the perforations 21R and 21L, and the terminals 26 are thrown over.

Figure 5:
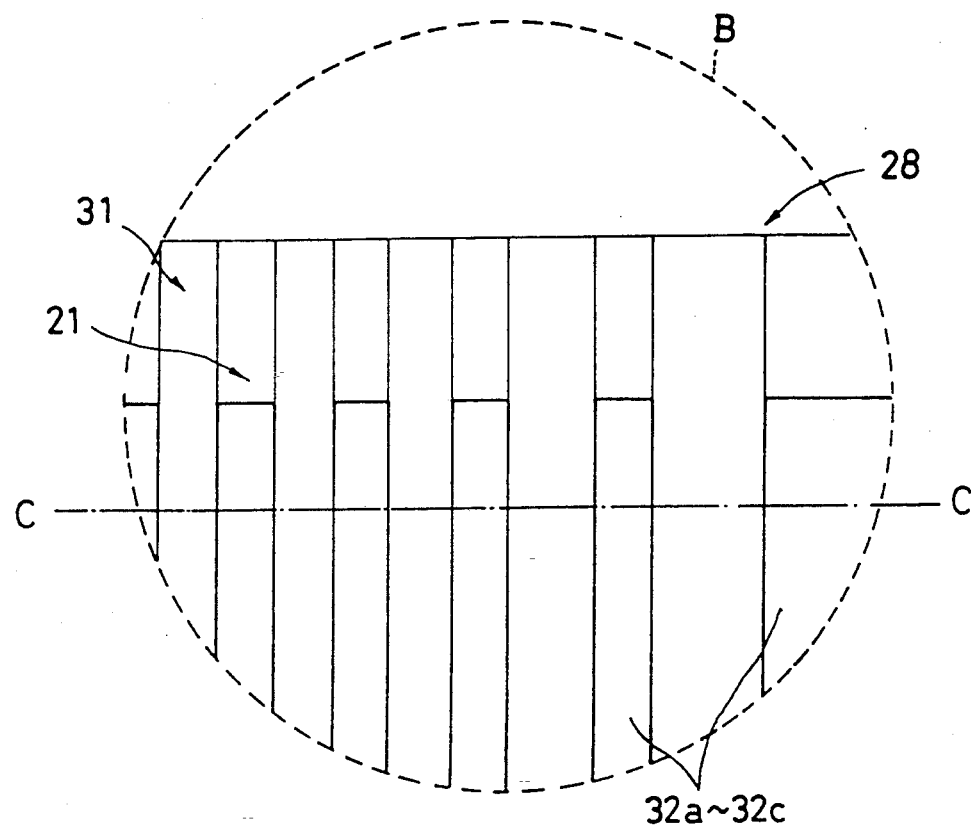
FIG. 5 is an expanded plane view showing an area B shown in FIG. 3.
Figure 6A:
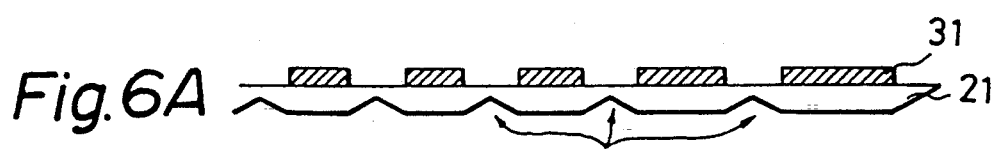
FIGS. 6A, 6B and 6C are sectional views cut on the line C—C of FIG. 5 respectively showing a plurality of slits formed on the flexible base material surface of the TAB package.
Figure 6B:
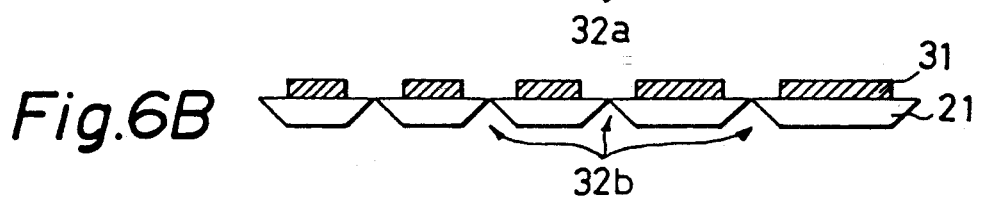
Figure 6C:
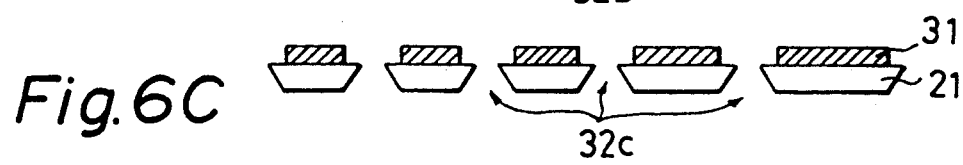

FIG. 5 is an expanded plane view showing the area B shown in FIG. 3. FIGS. 6A, 6B and 6C are sectional views cut on the line C—C of FIG. 5.

As shown in FIG. 5, the output-side outer leads 25 are made of copper conductive patterns 31, for example. These leads 25 are formed lengthwise in a linear manner and widthwise at given intervals.

Turning to FIGS. 6A, 6B and 6C, 32a, 32b and 32c denote slits formed on the opposite surface of the flexible base material 21 to the surface on which the copper conductive patterns 31 adjacent to the bending area 25a are formed. The opposite surface of the flexible base material 21 to the surface on which the copper conductive patterns 31 adjacent to the bending area 25a is subject to patterning treatment done by using a photoresist and chemical-etching treatment so that the slits 32a to 32c are formed at the intervals between the conductive patterns 31 adjacent to each other and the flexible base material 21 located under the conductive patterns 31 are left intact.

The slits 32a shown in FIG. 6A stop the penetration within the flexible base material 21. The slits 32b and 32c shown in FIGS. 6B and 6C penetrate through the flexible base material 21.

Those slits 32a, 32b and 32C, therefore, contribute to reducing the stress caused by the bending area 25 of the flexible base material 21, because the formation of the slits results in eroding some amount of the flexible base material 21 from the bending area 25.

Figure 8:
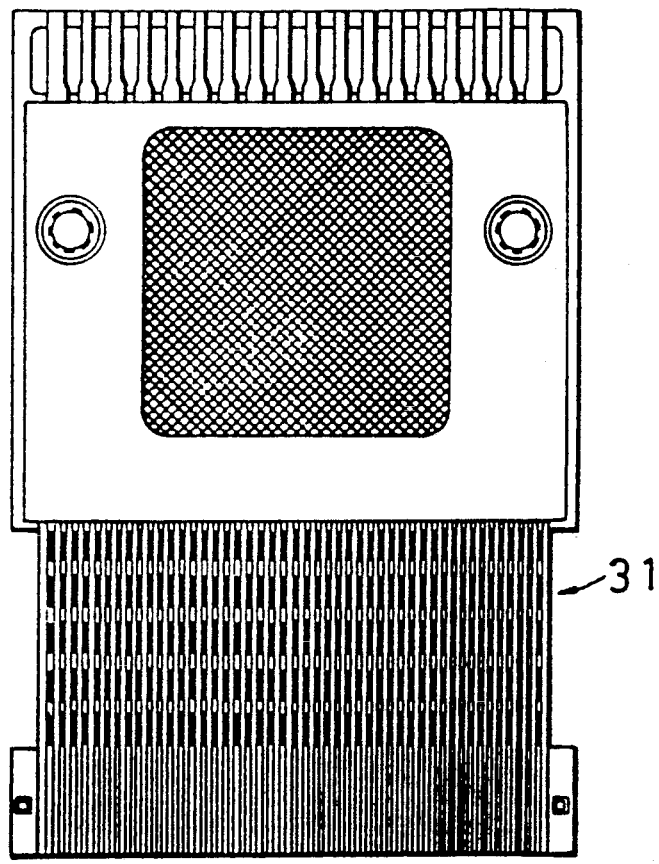
FIG. 8 is a plane view showing a conductive pattern surface side of the TAB package made by punching itself out from the tape-like flexible base material along the form punching line.
Figure 10:
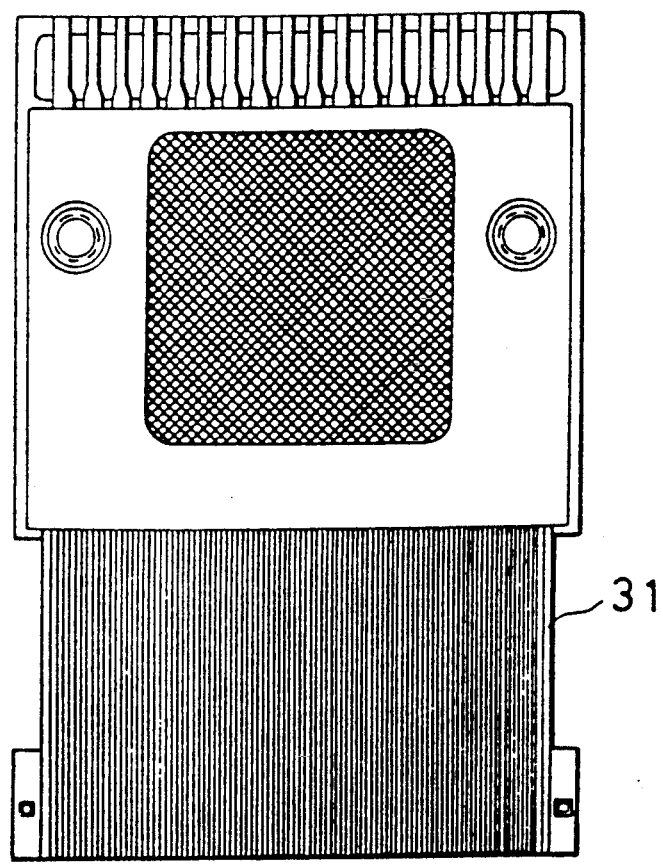
FIG. 10 is a plane view showing a conductive material surface side of the another TAB package made by punching itself out from the tape-like flexible base material along the form punching line.

FIG. 7 and FIG. 8 show the TAB package made by punching itself out from the flexible base material 21 enclosed in the outer punching line 29. FIG. 7 is a plane view showing the flexible base material 21 surface side, that is, the surface side having no conductive pattern of the TAB package and FIG. 8 is a plane view showing the conductive pattern 31 surface side of the TAB package. FIG. 9 and FIG. 10 show another embodiment of the TAB package made by punching itself out from the flexible base material 21 enclosed in the form punching line 29. FIG. 9 is a plane view showing the flexible base material 21 surface side of the TAB package and FIG. 10 is a plane view showing the conductive pattern 31 surface side of the TAB package.

In the embodiment shown in FIGS. 7 and 8, the slits 32d are formed lengthwise at given intervals on the opposite surface to the surface on which the conductive patterns 31 are formed. The slits 32d intermittently extend along the intervals between the adjacent conductive patterns 31. In the embodiment shown in FIGS. 9 and 10, the slits 32e are formed on the opposite surface to the surface on which the conductive patterns 31 are formed. The slits 32e extend along the overall length of each interval between the adjacent conductive patterns 31.

It is preferable that the slits 32e shown in FIGS. 9 and 10 may employ the slits 32a shown in FIG. 6A, that is, the slits which stop its erosion within the flexible base material 21 without penetrating therethrough. On the other hand, it is preferable that the slits 32d shown in FIGS. 7 and 8 may employ the slits 32b and 32c shown in FIGS. 6B and 6C which penetrate through the flexible base material 21. That is, the latter slits 32d are suitable to the adjacent conductive patterns 31 between which the short-circuit is likely to occur.

Figure 11:
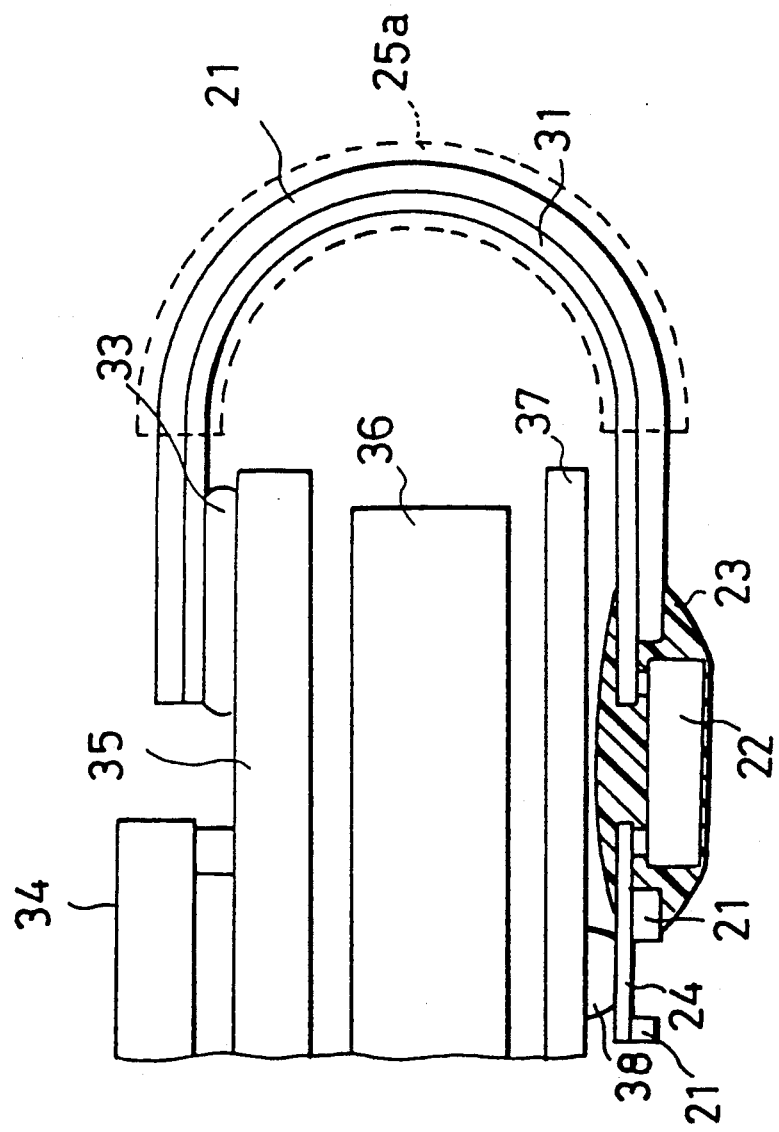
FIG. 11 is an explanatory view showing structure of a liquid-crystal panel unit using the TAB package according to an embodiment of the invention.
Figure 12:
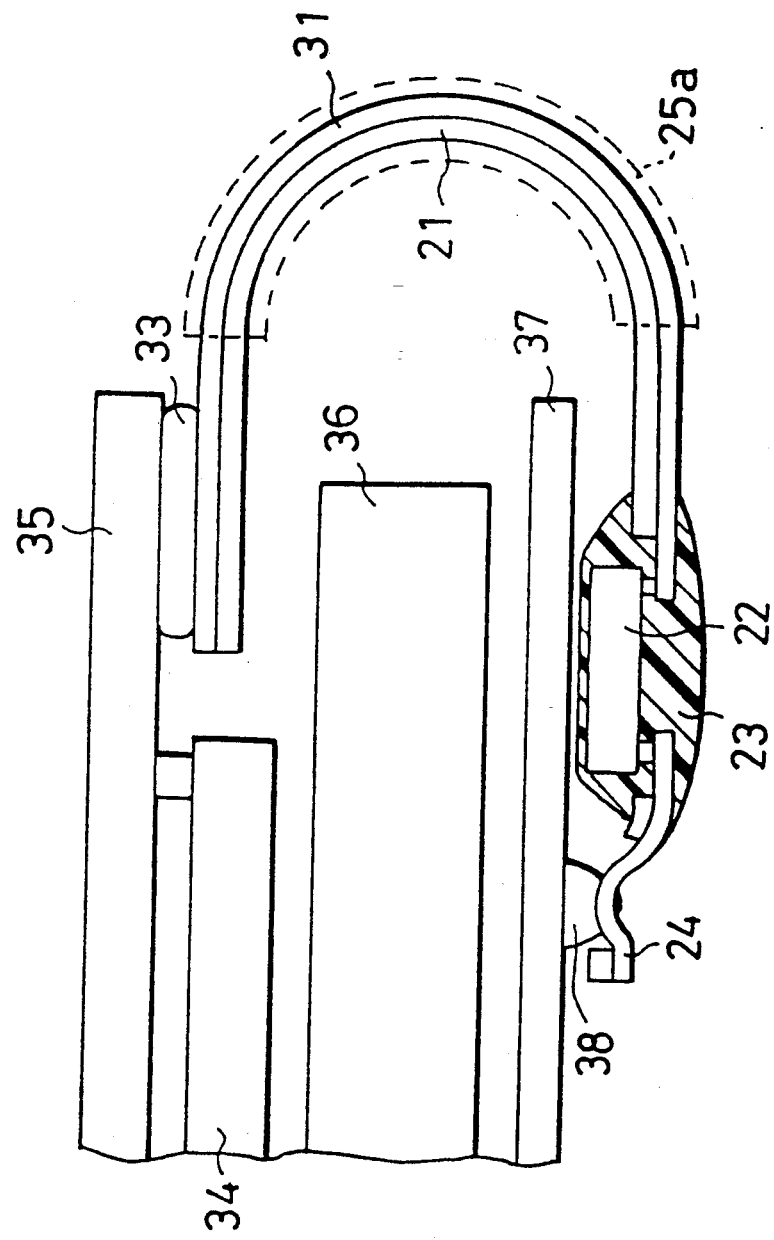
FIG. 12 is an explanatory view showing structure of a liquid-crystal panel unit using the TAB package according to an embodiment of the invention.

FIGS. 11 and 12 are explanatory views showing the structure of a liquid-crystal panel unit including the TAB package according to the invention. Those figures are used for the below-mentioned description about the manufacturing process of the liquid-crystal panel unit.

Then, the manufacturing process of the liquid-crystal panel unit will be described with reference to the drawings.

As shown in FIGS. 3 and 4, the portion enclosed in the form punching line 29 is punched out as the tape-like TAB package from the flexible base material 21 on the basis of the metal die. Next, with the proper treatment, the slits are formed on the flexible base material 21 surface of the TAB package. The slits are allowed to employ the forms of the TAB package shown in FIGS. 7 and 8 or FIGS. 9 and 10.

Turning to FIG. 11, first, the output-side outer leads 25 are connected to the electrodes 35 of the liquid-crystal panel 34 by using an anisotropic conductive film (ACF) 33. Second, a back lighting unit 36 for the liquid-crystal panel 34 is backed on the rear surface of the liquid-crystal panel 34. Third, the bending area 25a of the TAB package is bent so that the flexible base material 21 surface side of the TAB package is exposed outside as shown in FIG. 11. Last, the input-side outer leads 24 are connected by solder 38 to the conductive patterns formed on the printed circuit board 37 located at the rear side of the back lighting unit 36.

As another method, as shown in FIG. 12, the bending area 25a of the TAB package is allowed to be bent for connecting between the liquid-crystal panel 34 and the printed circuit board 37 so that the conductive patterns 31 surface side of the TAB package is exposed outside.

As set forth above, according to the aforementioned embodiments, the slits 32a to 32e shown in FIGS. 6A, 6B, 6C to 10 are formed on the bending area 25a of the flexible base material 21. The formation of the slits contributes to reducing the amount of the flexible base material 21 contained in the bending area 25a. It results in lessening the repulsive force, that is, the restoring force of the flexible base material 21.

It is, therefore, possible to connect the output-side outer leads 25 of the TAB package to the liquid-crystal panel 34 and the input-side outer leads 24 of the TAB package to the printed circuit board 37 without taking the steps of bending the flexible base material 21 and keeping the state for soldering. It results in enhancing reliability of the connecting portion formed by using the anisotropic conductive film 33 and the solder 38.

The slits 32a to 32e are formed on the flexible base material 21 corresponding to the intervals between the adjacent conductive patterns in order to allow the conductive patterns to be supported by the flexible base material 21 corresponding to the conductive patterns. Though, therefore, the bending of the TAB package brings about the external force such as tension or compressive stress, it is possible to prevent the conductive patterns from being broken or cracked by the external force such as tension or compressive stress.

Many widely different embodiments of the present invention may be constructed without departing from the spirit and scope of the present invention. It should be understood that the present invention is not limited to the specific embodiments described in the specification, except as defined in the appended claims.

What is claimed is:

1. A TAB package for packaging a semiconductor chip comprising:
    a flexible base plate having a first surface and a second surface opposite to said first surface, said flexible base plate being formed by a tape-like insulated material;
    conductive patterns being formed on said second surface of said flexible base plate and capable of being connected to said semiconductor chip; and
    a plurality of slits being formed on said first surface of said flexible base plate and being formed between said conductive patterns.

2. A TAB package according to claim 1, wherein said plurality of slits are formed on a bending area of the flexible base plate.

3. A TAB package according to claim 1, wherein said TAB package is made by punching a corresponding form out of said flexible base plate.

4. A TAB package according to claim 1, wherein said conductive patterns include input leads and output leads.

5. A TAB package according to claim 1, wherein said plurality of slits are formed along said conductive patterns.

6. A TAB package according to claim 1, wherein said plurality of slits are formed to penetrate through said flexible base plate.

7. A TAB package according to claim 1, wherein said plurality of slits are formed to stop its penetration within said flexible base plate.

8. A liquid-crystal panel unit using a TAB package for packaging a semiconductor chip, said unit including a liquid-crystal panel and a printed circuit board, comprising:

a flexible base plate for connecting said liquid-crystal panel to said printed circuit board,
  said flexible base plate having a first surface and a second surface opposite to said first surface, said flexible base plate being formed by a tape-like insulated material;
  conductive patterns being formed on said second surface of said flexible base plate and capable of being connected to said semiconductor chip; and
  a plurality of slits being formed on said first surface of said flexible base plate and being formed between said conductive patterns.

9. A TAB package according to claim 8, wherein said conductive patterns include input leads and output leads.

10. A TAB package according to claim 8, wherein said plurality of slits are formed along said conductive patterns.

11. A TAB package according to claim 8, wherein said plurality of slits are formed to penetrate through said flexible base plate.

12. A TAB package according to claim 8, wherein said plurality of slits are formed to stop its penetration within said flexible base plate.

13. A liquid-crystal panel according to claim 9, wherein said input and output leads include input-side outer leads for connecting said semiconductor chip to said printed circuit board, and output-side outer leads for connecting said semiconductor chip to said liquid-crystal panel.

14. A liquid-crystal panel according to claim 13, wherein said output-side outer leads are connected to said liquid-crystal panel by using an anisotropic conductive film and said input-side outer leads are connected to said printed circuit board by using solder.

* * * * *

UNITED STATES PATENT AND TRADEMARK OFFICE
CERTIFICATE OF CORRECTION

PATENT NO. : 5,153,705

DATED : October 6, 1992

INVENTOR(S) : Kazuhiko Fukuta et al

It is certified that error appears in the above-identified patent and that said Letters Patent is hereby corrected as shown below:

Title page, item [75], the name of the inventor "Tsuda" should be corrected as follows:

"Takaski Tsuda" should read -- Takaaki Tsuda --.

Signed and Sealed this

Twelfth Day of October, 1993

*Attest:*

BRUCE LEHMAN

*Attesting Officer*   *Commissioner of Patents and Trademarks*